(12) United States Patent
Zhou (10) Patent No.: US 8,506,829 B2
(45) Date of Patent: Aug. 13, 2013

(54) SEMICONDUCTOR HOLLOW-CORE WAVEGUIDE USING PHOTONIC CRYSTAL GRATINGS

(75) Inventor: Weimin Zhou, Rockville, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 253 days.

(21) Appl. No.: 12/699,911

(22) Filed: Feb. 4, 2010

(65) Prior Publication Data

US 2011/0188801 A1  Aug. 4, 2011

(51) Int. Cl.
*B29D 11/00* (2006.01)

(52) U.S. Cl.
USPC ............... 216/24; 216/2; 385/14; 385/129

(58) Field of Classification Search
USPC ........................................... 430/296
See application file for complete search history.

(56) References Cited

U.S. PATENT DOCUMENTS

| 6,243,517 | B1 * | 6/2001 | Deacon | 385/50 |
| 6,373,872 | B2 * | 4/2002 | Deacon | 372/34 |
| 6,393,185 | B1 * | 5/2002 | Deacon | 385/50 |
| 7,609,919 | B2 * | 10/2009 | Tolstikhin et al. | 385/37 |
| 2004/0020893 | A1 * | 2/2004 | Drake et al. | 216/3 |

OTHER PUBLICATIONS

Zhou et al, A novel ultra-low loss hollow-core waveguide using subwavelength high-contrast gratings, Feb. 2, 2009, Optics Express, vol. 17, No. 3, p. 1508-1514.*

* cited by examiner

*Primary Examiner* — Binh X Tran
*Assistant Examiner* — David Cathey, Jr.
(74) *Attorney, Agent, or Firm* — Alan I. Kalb (57) ABSTRACT

A semiconductor hollow-core waveguide using high-contrast gratings or photonic crystal claddings and a method of manufacturing the same includes providing a layered semiconductor structure; creating an etching mask pattern over the layered semiconductor structure; performing a combined cycled directional etching process on the layered semiconductor structure in one sequence and in one lithography level to create a 3-dimensional waveguide structure; and creating a hollow air core in the layered semiconductor structure by removing to define a shape of the waveguide. The etching process comprises vertically etching a series of deep trenches on the layered semiconductor structure with precise control and varying the width of the trench. Furthermore, the hollow air core is created by removing a portion of the sacrificial material located in the center of the waveguide and under the waveguide.

5 Claims, 7 Drawing Sheets

SEMICONDUCTOR HOLLOW-CORE WAVEGUIDE USING PHOTONIC CRYSTAL GRATINGS

GOVERNMENT INTEREST

The embodiments herein may be manufactured, used, and/or licensed by or for the United States Government without the payment of royalties thereon.

BACKGROUND

1. Technical Field

The embodiments herein generally relate to semiconductor processing techniques, and, more particularly, to techniques for processing a semiconductor hollow-core waveguide.

2. Description of the Related Art

The squared high index ratio grating hollow-core waveguide (HW) concept was introduced by the University of California at Berkeley as described in Zhou et al., "A novel ultra-low loss hollow-core waveguide using subwavelength high-contrast gratings," Optics Express, Vol. 17, No., 3, ppg. 1508-1517, Feb. 2, 2009, the complete disclosure of which, in its entirety, is herein incorporated by reference. HWs are highly promising for achieving fiber-like ultra-low loss and nonlinearity because of the elimination of the core material. However, no practical processing technique to fabricate such a device was introduced. Moreover, to fabricate an alternative waveguide device that is not squared is very complex, unpractical, and expensive.

SUMMARY

In view of the foregoing, an embodiment herein provides a method of manufacturing a semiconductor hollow-core waveguide using high-contrast gratings or a photonic crystal structure, the method comprising providing a layered semiconductor structure; creating an etching mask pattern over the layered semiconductor structure; wherein the etching mask pattern comprises a series of parallel lines with line spacing equal to a grating pitch or photonic crystal period, wherein a line width is equal to a high index grating line width, wherein a substantially center portion of each line comprises at least two square-shaped features dimensioned and configured approximately twice of the line width to define a position of a pair of vertical posts, and wherein the square-shaped features are aligned to allow the posts to foci any of vertical gratings and vertical photonic crystal claddings for a hollow core waveguide; performing a combined cycled directional etching process on the layered semiconductor structure in one sequence and in one lithography level to create a waveguide; creating a hollow air core in the layered semiconductor structure by a controlled undercut etching process that removes material between a top and bottom grating lines or photonic crystal claddings and forms the pair of vertical posts as any of the vertical gratings and the photonic crystal claddings to define a shape of the waveguide; and performing a second undercut etching process to remove a sacrificial-layer material under the waveguide.

In one embodiment, the step of providing the layered semiconductor structure comprises providing a substrate; providing a sacrificial layer over the substrate; and providing a plurality of semiconductor-based layers over the sacrificial layer, wherein the sacrificial layer comprises a material that can be selectively etched without etching the semiconductor-based layers on top of the sacrificial layer, wherein a top layer of the layered semiconductor structure above the sacrificial layer comprises a thickness equal to a total height of the waveguide, and wherein the sacrificial layer comprises a thickness greater than half of a wavelength of an operating wave of the waveguide.

In another embodiment, the step of providing the layered semiconductor structure comprises providing a first semiconductor-based layer; providing a first sacrificial layer over the first semiconductor-based layer, wherein the first sacrificial layer comprises a thickness substantially equal to a total thickness of the hollow air core; providing a second semiconductor-based layer over the first sacrificial layer; providing a second sacrificial layer over the second semiconductor-based layer, wherein the second sacrificial layer comprises a thickness greater than half of a wavelength of an operating wave of the waveguide; and providing a third semiconductor-based layer over the second sacrificial layer, wherein the first and second sacrificial layers comprise a material that can be selectively etched without etching the semiconductor-based layers on top of the first and second sacrificial layers.

The method may further comprise creating the etching mask pattern by any of direct e-beam writing and projection photolithography to create a resist mask by lithography. Additionally, the method may further comprise creating the etching mask pattern by depositing a mask transfer material layer on the layered semiconductor structure; performing e-beam lithography with any of an e-beam resist mask and photolithography with a photoresist mask on top of the mask transfer material layer; and etching the mask transfer material layer to transfer the e-beam resist mask to the layered semiconductor structure.

Moreover, the method may further comprise creating the etching mask pattern by using nano-imprinting to create an etching mask. The cycled directional etching process comprises vertically etching a top layer of the layered semiconductor structure to create a series of trenches that follow the etching mask pattern. Additionally, the method may further comprise depositing a first material comprising any of a polymer layer and dielectric layer over the surfaces of etched trenches in a top layer of the layered semiconductor structure; vertically etching the first material on a bottom surface of a trench; and semi-isotropically etching the layered semiconductor structure to continue vertical trench etching through a core region and laterally open the trench for half of the width of the grating lines defined by the mask to create the hollow air core, while leaving unetched material under the square-shaped features to form the pair of vertical posts as gratings for a pair of side claddings of the waveguide.

The method may further comprise performing a dry etching process on the layered semiconductor structure to create a deep trench; and performing a wet-chemical etching process to laterally open the trench to create the hollow air core. The etching process may comprise vertically etching a bottom cladding layer under the hollow air core to create a trench having the same width of a mask opening; depositing a second material comprising any of a polymer layer and dielectric layer to walls of the trench of the bottom cladding layer of the layered semiconductor structure; etching the second material on the surface of the trench in the bottom cladding layer; and selectively etching the sacrificial layer under the bottom cladding layer.

Another embodiment provides a method of manufacturing a semiconductor hollow-core waveguide using any of high-contrast gratings and photonic crystal cladding, the method comprising providing a layered semiconductor structure comprising a substrate; a sacrificial layer over the substrate; and a plurality of semiconductor-based layers over the sacrificial layer; creating an etching mask pattern over the plurality of semiconductor-based layers; performing a combined cycled directional etching process on the layered semiconductor structure to create a series of deep trenches that define gratings for a cladding of the waveguide; removing a portion of the semiconductor based-layers located in the center of the waveguide to create a hollow air core in the layered semiconductor structure to define a shape of the waveguide; and removing the sacrificial layer under the waveguide, wherein a top layer of the layered semiconductor structure comprises a thickness equal to a total height of the waveguide, and wherein the sacrificial layer comprises a thickness greater than half of a wavelength of an operating wave of the waveguide.

The method may further comprise creating the etching mask pattern using any of direct e-beam writing to create a resist mask by any of lithography and photolithography; and nano-imprinting to create an etching mask, wherein the etching mask pattern comprises a series of parallel lines with line spacing equal to a grating pitch or photonic crystal period, wherein a line width is equal to a high index grating line width, wherein a substantially center portion of each line comprises at least two square-shaped features dimensioned and configured approximately twice of the line width to define a position of a pair of vertical posts, and wherein the square-shaped features are aligned to allow the posts to form any of vertical gratings and vertical photonic crystal claddings for a hollow core waveguide.

Alternatively, the method may further comprise creating the etching mask pattern by depositing a mask transfer material layer on the layered semiconductor structure; performing lithography with a resist mask on top of the mask transfer material layer; and etching the mask transfer material layer to transfer the e-beam resist mask to the layered semiconductor structure.

The etching process may comprise vertically etching a top layer of the layered semiconductor structure using the mask. Moreover, the method may further comprise depositing a first material comprising any of a polymer layer and dielectric layer over the surfaces of etched trenches in a top layer of the layered semiconductor structure; vertically etching the first material on a bottom surface of a trench; and semi-isotropically etching the layered semiconductor structure to continue vertical trench etching through a core region and laterally open the trench for half of the width of the grating lines defined by the mask to create the hollow air core, while leaving unetched material under the square-shaped features to form the pair of vertical posts as gratings for a pair of side claddings of the waveguide.

Furthermore, the etching process may comprise depositing a second material comprising any of a polymer layer and a silicon dioxide layer adjacent to the top layer and the etched layered semiconductor structure; vertically etching the second material to create a trench in a bottom cladding layer; and etching a bottom cladding layer of the layered semiconductor structure until reaching the sacrificial layer.

Another embodiment provides a semiconductor hollow-core waveguide comprising any of high-contrast gratings and photonic crystal cladding, the semiconductor hollow-core waveguide comprising a layered semiconductor structure comprising a substrate; a sacrificial layer over the substrate; and a plurality of semiconductor-based layers over the sacrificial layer. The waveguide further comprises a series of deep trenches that define gratings for a cladding of the waveguide formed by using an etching mask pattern over the plurality of semiconductor-based layers, and performing a combined cycled directional etching process on the layered semiconductor structure; and a hollow air core in the layered semiconductor structure that defines a shape of the waveguide, wherein the hollow air core is created by removing a portion of the semiconductor based-layers located in the center of the waveguide, wherein the sacrificial layer is removed from under the waveguide, wherein a top layer of the layered semiconductor structure comprises a thickness equal to a total height of the waveguide, and wherein the sacrificial layer comprises a thickness greater than half of a wavelength of an operating wave of the waveguide.

Preferably, the etching mask pattern comprises a series of parallel lines with line spacing equal to a grating pitch or photonic crystal period, wherein a line width is equal to a high index grating line width, wherein a substantially center portion of each line comprises at least two square-shaped features dimensioned and configured approximately twice of the line width to define a position of a pair of vertical posts, and wherein the square-shaped features are aligned to allow the posts to form any of vertical gratings and vertical photonic crystal claddings for a hollow core waveguide. Moreover, the etching process may comprise vertically etching a top layer of the layered semiconductor structure using the mask.

The semiconductor hollow-core waveguide may further comprising a first material comprising any of a polymer layer and dielectric layer over the surfaces of etched trenches in a top layer of the layered semiconductor structure, wherein the first material is vertically etched on a bottom surface of a trench, and wherein the layered semiconductor structure is semi-isotropically etched to continue vertical trench etching through a core region and laterally open the trench for half of the width of the grating lines defined by the mask to create the hollow air core, while leaving unetched material under the square-shaped features to form the pair of vertical posts as gratings for a pair of side claddings of the waveguide.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIGS. 4 through 8B illustrate cross-section views of a HW undergoing sequential processing steps according to an embodiment herein;

DETAILED DESCRIPTION OF PREFERRED EMBODIMENTS

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide a method of fabricating a hollow-core waveguide (HW) using high-contrast gratings or photonic crystal. Referring now to the drawings, and more particularly to FIGS. 1A through 9B, were similar reference characters denote corresponding features consistently throughout the figures, there are shown preferred embodiments.

Figure 1A:
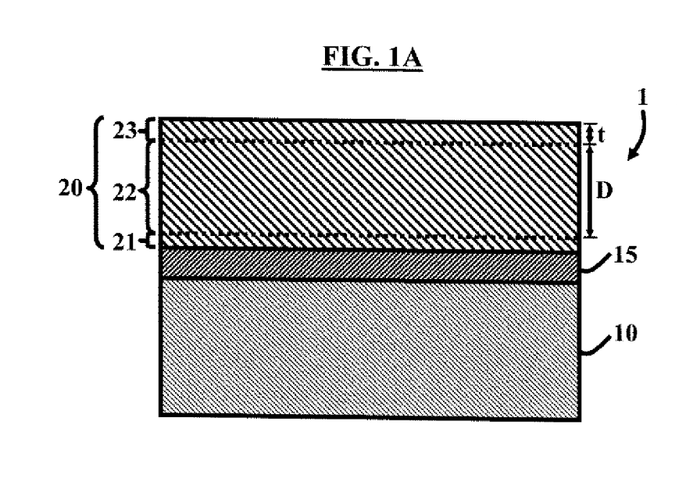
FIG. 1A illustrates a schematic diagram of a layered semiconductor-based structure according to a first embodiment herein.

Initially, a layered semiconductor-based material is selected. Different types of layered semiconductor-based materials can be used in accordance with the embodiments herein. An example of a first type of layered structure 1 includes a silicon-on-insulator (SOI) wafer comprising two layers 15, 20 on top of a semiconductor substrate 10 as shown in FIG. 1A. The semiconductor substrate 10 may comprise silicon (Si) or indium phosphide (InP). The top layer 20 comprises a thickness equal to the total height of the waveguide. The top layer 20 may comprise material that is substantially similar in material composition as the substrate 10. The top layer 20 comprises various regions including a bottom cladding layer 21, a middle (core) layer 22 having a thickness D, and a top cladding layer 23 having a thickness t. The second layer 15 is a sacrificial layer having a thickness larger than half of the wavelength of the operating wave of the waveguide. The second layer 15 may comprise silicon dioxide ($SiO_2$) or indium gallium arsenide (InGaAs), for example. The material used in the second layer 15 can be selectively etched by a liquid or gas etcher without etching the top layer 20. Preferably, layers 15, 20 have a similar index of refraction.

Figure 1B:
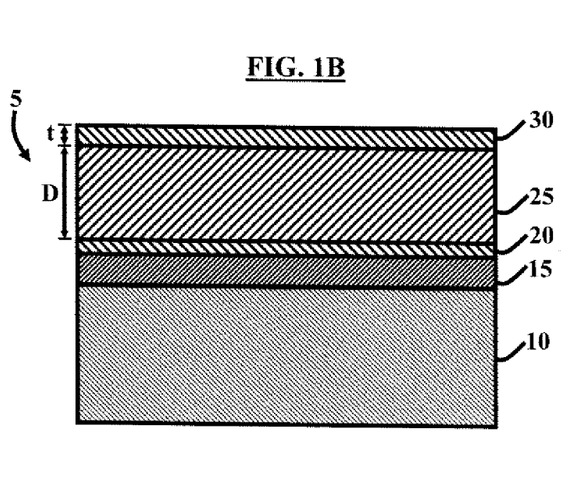
FIG. 1B illustrates a schematic diagram of a layered semiconductor-based structure according to a second embodiment herein.

Alternatively, an example of a second type of layered structure 5 is shown in FIG. 1B and comprises layers 15, 20, 25, 30 on top of a semiconductor silicon substrate 10. The top layer 30 may comprise Si and has a thickness substantially equal to the thickness of the top HCG cladding material 23. The second layer 15, which may comprise $SiO_2$, is a sacrificial layer having a thickness near the dimension of what will become the hollow core 120 of FIG. 9B (comparable to thickness D of middle layer 22) of the waveguide. The third layer 20 has a thickness near the thickness of the bottom HCG cladding material 21. The material composition of the third layer 20 can be substantially similar then that of the top layer 30. The material used in the third layer 20 preferably cannot be etched by a liquid or gas etcher used to etch the second layer 15. Preferably, layers 15, 20, 30 have a similar index of refraction. The fourth layer 25 is a sacrificial layer having a thickness larger than half of the wavelength of operating wave of the waveguide. The material composition of the fourth layer 25 can be substantially similar to that of the second layer 15. The material used in the fourth layer 25 can be selectively etched by a liquid or gas etcher without etching the top layer 30 and the third layer 20. An example of such a material is an epitaxially grown InP/InGaAs/InP/InGaAs/InP-substrate or commercial dual SOI wafer with Si/$SiO_2$/Si/$SiO_2$/Si-substrate. Another alternative is to have the fourth layer 25 to be the substrate, where an example of such a layered structure is InGaAs/InP/InGaAs/InP-substrate.

Figure 2:
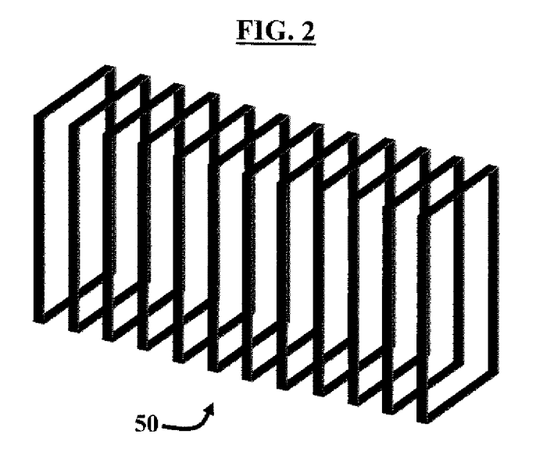
FIG. 2 illustrates a perspective view of a square-shape hollow-core waveguide (HW) using high-contrast gratings or photonic crystal according to an embodiment herein.
Figure 3:
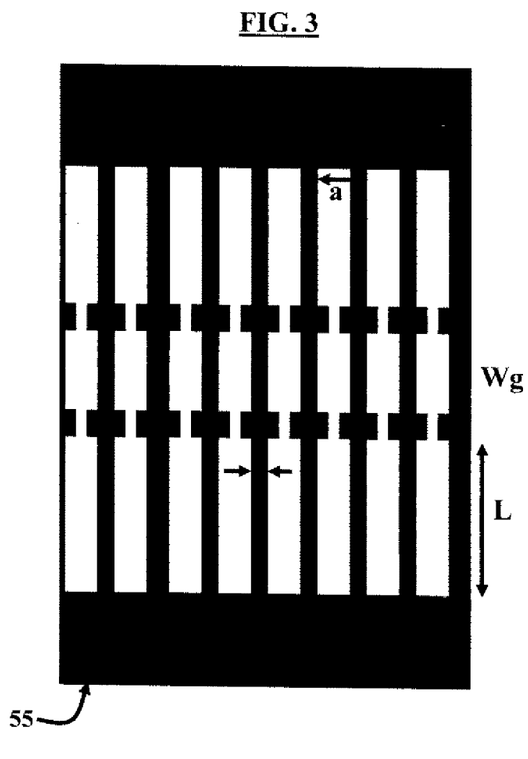
FIG. 3 illustrates a top view of the etching mask pattern to create the HW of FIG. 2 according to an embodiment herein.

Next, an etching mask pattern is performed. To fabricate the square-shape HW-HCG 50 as shown in FIG. 2 using this method, one may design an etching mask pattern 55 as shown in the top surface view of FIG. 3 where the center portion is configured for the HW-HCG. "Wg" is preferably configured to be close to the width of the core, "t" is preferably configured to be close to the thickness of the grating's high index beams, and "d" is preferred to be about three times the length of "t". "L" is the length of supporting beam which is larger then half of the wavelength. The repeat pitch "a" is preferably the same as the grating period.

Figure 4:
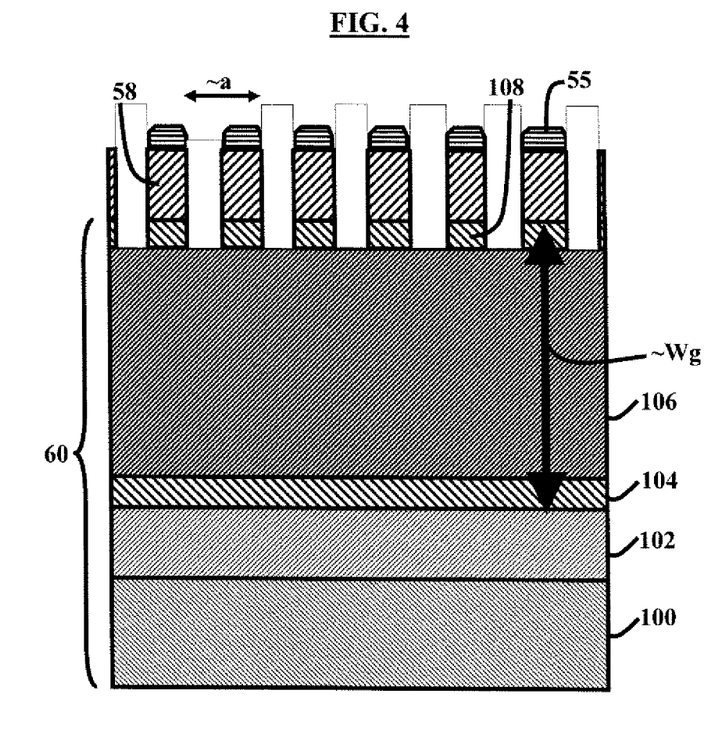

With reference to FIG. 4, the etching mask 55 may be created by e-beam lithography. Examples of three methods to create the etch mask 55 depending on the material used and etch techniques used are as follows. First, direct e-beam writing to create the e-beam resist mask 55 by lithography may be used. Second, a mask transfer material layer 58 may be deposited in order to perform e-beam lithography with the e-beam resist mask 55 on top, and etching the mask transfer material 58 to transfer the mask 55. Third, nano-imprint technology may be used to create the etching mask 55.

FIGS. 4 through 8B, with reference to FIGS. 1A through 3, illustrate a layered semiconductor wafer 60 in sequential fabrication steps. If a first type of layered structure 1 is used in accordance with the embodiment shown in FIG. 1A, then layers 100, 104, 106, and 108 comprise Si layers, and layer 102 comprises a $SiO_2$ layer. If a second type of layered structure 5 is used in accordance with the embodiment shown in FIG. 1B, then layers 100, 104, and 108 comprise Si layers, and layers 102 and 106 comprise $SiO_2$ layers. Furthermore, as mentioned above, InP and InGaAs may be used instead of Si and $SiO_2$, respectively. In a first dry etching step, after the mask 55 is formed on the top surface 58 of the layered semiconductor wafer 60, a plasma etching technique is selected that can vertically etch the top layer material 108, once the etch depth reach the vertical thickness of the grating "t", or cladding layer thickness, the etching process is stopped as shown in FIG. 4.

Figure 5:
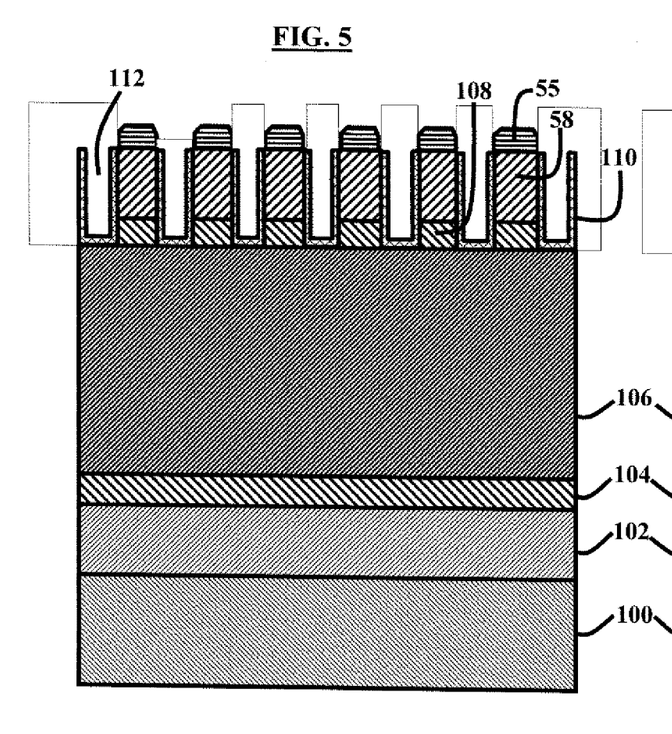

Next, a second deep trench dry etching and width opening process occurs. For the first type of layered structure 1 (i.e., the embodiment of FIG. 1A), a polymer passivation process occurs by depositing a polymer layer 110 using well-known plasma etch/deposition techniques, (for example: for Si, $CF_2+H_2$ gas can be used for the plasma deposition which will turn to→$CHF_3$,) or depositing a $SiO_2$ coating 110 by plasma-enhanced chemical vapor deposition (PECVD). Then, a high energy, low pressure plasma etching process is used to vertically etch through the bottom of the deposited material 110 as shown in FIG. 5, (for example: for Si, use Ar+, or $SF_6$+Ar).

Figure 6:
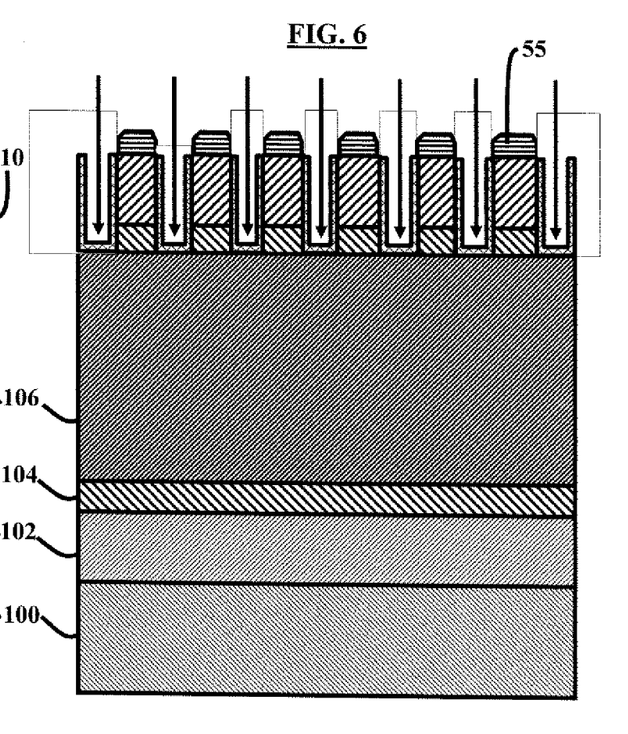
Figure 7:
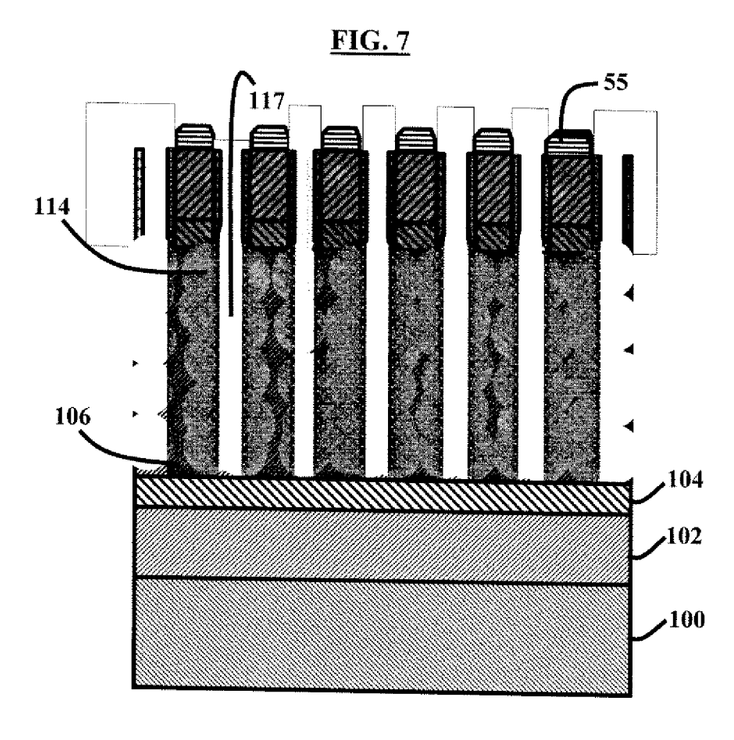

Through the opening 112 made in the previous step, a semi-isotropical etch process occurs such that more etching occurs vertically downward. Then, the structure is opened laterally to form what will become the hollow core of the waveguide until the opening reaches the bottom of the designed core as shown in FIG. 6. Here, the lateral etch is controlled very precisely such that it occurs to just undercut the core area 114 under the top grading beam, but not cut through the vertical grating beams (lateral etch depth is approximately ½t as shown in FIG. 7. This step can be achieved by different etching methods including: (1) modifying the process of the previously used dry etch in last step such as reducing energy (radio frequency (RF)-power), increasing gas pressure, and/or changing gas composition; or (2) a combined dry and wet-chemical etch; or (3) a cycled etching process of semi-isotropic-etching/passivation/vertical-etching.

For the second type of layered structure 5 (i.e., the embodiment of FIG. 1B), the etching process is similar to that described above, however since the core layer material 25 is different than the top layer 30, a selective dry etch recipe can be used to etch the core layer 25 without the first polymer or $SiO_2$ passivation/coating process. The cycled etching process may still needed to do the deep trench etch. The width opening of the trench can be performed by a wet-chemical etch.

Figure 8A:
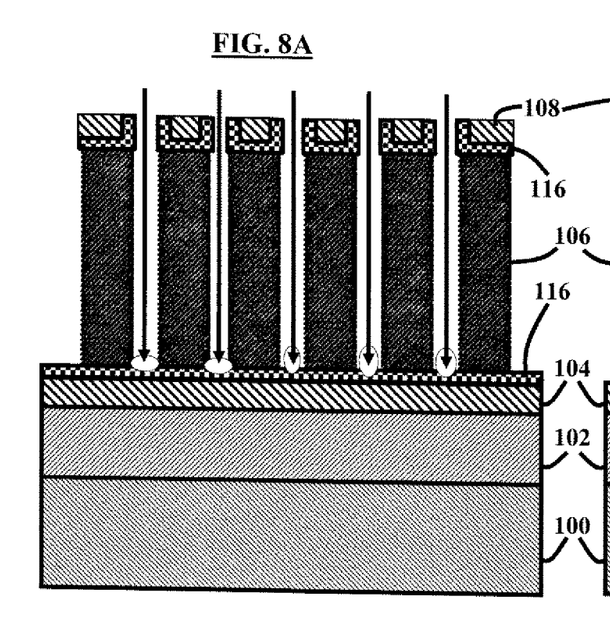

Next, a third etching step occurs to etch through to the bottom grating material (layer 104). Here, a polymer passivation occurs by depositing a polymer coating 116 using well-known plasma etch/deposition techniques, (for example: for Si, $CF_2+H_2$ gas can be used for the plasma deposition which will turn to→$CHF_3$,) or depositing a $SiO_2$ coating 116 by PECVD. Then, a high energy, low pressure plasma etching process occurs to vertically etch through to the bottom of the deposited material 116, (for example for Si: use Ar+, or $SF_6+Ar$). Through the opening 117 made in the previous step, the bottom cladding/grating material 104 is etched vertically as shown in FIG. 8A. In one embodiment, the first, second, and third etching steps may be performed in one sequence of cycled selective/directional dry etching in a same plasma etching chamber (not shown).

Figure 8B:
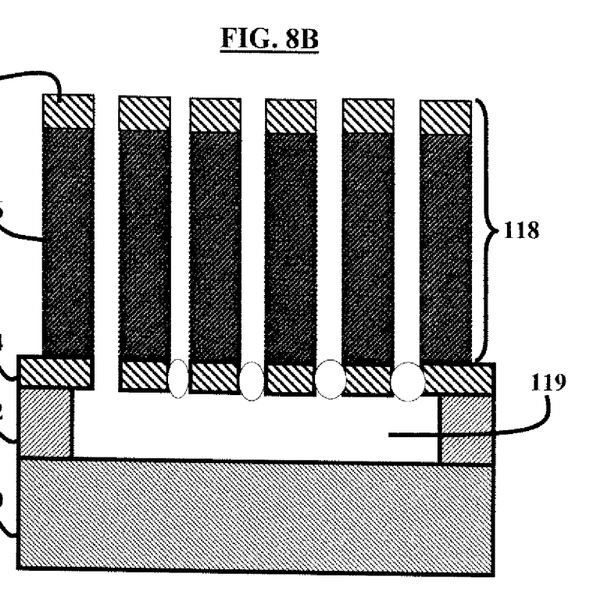
Figures 9A, 9B:
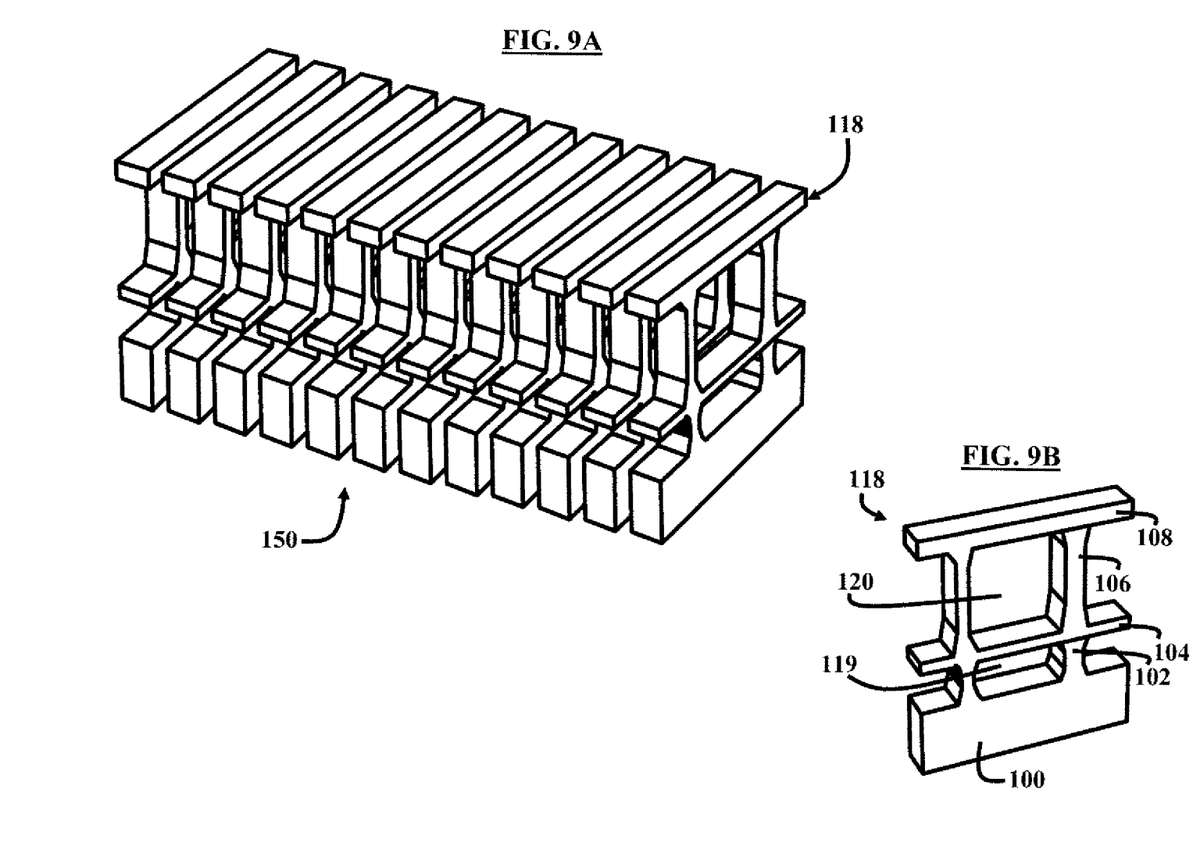
FIG. 9A illustrates a perspective view of a HW according to an embodiment herein.
FIG. 9B illustrate a perspective view of a single waveguide of the HW of FIG. 9A according to an embodiment herein.

Thereafter, a fourth etching step occurs (e.g., a selective wet chemical etching process) to remove the sacrificial layer 102 under the waveguide 118 as shown in FIG. 8B. The final 3D HW-HCG structure 150 is shown in FIG. 9A, with a single waveguide 118 shown in FIG. 9B having an air core 120 therein. In one example, for SOI material, the sacrificial layer 102 comprises $SiO_2$, and one can use a buffered hydrofluoric acid (HF) oxide etch to remove $SiO_2$ without etching the Si material 100.

Compared with conventional on-chip waveguide devices, the device 150 provided by the embodiments herein produces ultra low waveguide losses. Also, compared with conventional fabrication processes for nano-scale three-dimensional (3D) semiconductor devices (such as a 3D photonic crystal waveguide), which often involve having multiple e-beam lithography and photolithography processes with alignments, wafer bonding with alignment, crystal re-growth steps, and numerous separate etching steps, the low cost and practical manufacturing techniques provided by the embodiments herein only require one lithography level by ether direct e-beam or imprint, etc., and only one cycled selective/directional dry etching, and only one wet-chemical selective etch without any alignment, re-growth, wafer-bonding, etc.

The embodiments herein may be used for making 3D photonic crystal devices and integrated optoelectronic and photonic circuits. Generally, the embodiments herein provide techniques for performing a high aspect ratio deep trench etching of a semiconductor with a sub-micrometer mask opening and controlled variable trench width. Furthermore, the embodiments herein allow for the processing of a nano-scale 3D periodic structure from a two-dimensional (2D) top surface with one lithography level and a controlled cycled selective/directional etching process.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A method of manufacturing a semiconductor hollow-core waveguide using any of high-contrast gratings and photonic crystal cladding, said method comprising:
   providing a layered semiconductor structure comprising:
      a substrate;
      a sacrificial layer over said substrate; and
      a plurality of semiconductor-based layers over said sacrificial layer;
   creating an etching mask pattern over said plurality of semiconductor-based layers;
   performing a combined cycled directional etching process on said layered semiconductor structure to create a series of deep trenches that define gratings for a cladding of said waveguide;
   removing a portion of said semiconductor based-layers located in the center of said waveguide to create a hollow air core in said layered semiconductor structure to define a shape of said waveguide; and
   removing said sacrificial layer under said waveguide,
   wherein a top layer of said layered semiconductor structure comprises a thickness equal to a total height of said waveguide, and
   wherein said sacrificial layer comprises a thickness greater than half of a wavelength of an operating wave of said waveguide.

2. The method of claim 1, further comprising creating said etching mask pattern using any of:
   direct e-beam writing to create a resist mask by any of lithography and photolithography; and
   nano-imprinting to create an etching mask,
   wherein said etching mask pattern comprises a series of parallel lines with line spacing equal to a grating pitch or photonic crystal period, wherein a line width is equal to a high index grating line width, wherein a substantially center portion of each line comprises at least two square-shaped features dimensioned and configured approximately twice of said line width to define a position of a pair of vertical posts, and wherein said square-shaped features are aligned to allow the posts to form any of vertical gratings and vertical photonic crystal claddings for a hollow core waveguide.

3. The method of claim 1, further comprising creating said etching mask pattern by:
   depositing a mask transfer material layer on said layered semiconductor structure;
   performing lithography with a resist mask on top of said mask transfer material layer; and
   etching said mask transfer material layer to transfer said e-beam resist mask to said layered semiconductor structure.

4. The method of claim 1, wherein said etching process comprises vertically etching a top layer of said layered semiconductor structure using said mask.

5. The method of claim 4, further comprising:
   depositing a first material comprising any of a polymer layer and dielectric layer over the surfaces of etched trenches in a top layer of said layered semiconductor structure;

vertically etching said first material on a bottom surface of a trench; and semi-isotropically etching said layered semiconductor structure to continue vertical trench etching through a core region and laterally open said trench for half of the width of the grating lines defined by the mask to create said hollow air core, while leaving unetched material under said square-shaped features to form said pair of vertical posts as gratings for a pair of side claddings of said waveguide.

* * * * *